United States Patent [19]
Koyanagi et al.

[11] Patent Number: 5,818,755
[45] Date of Patent: Oct. 6, 1998

[54] STORAGE APPARATUS HAVING A NONVOLATILE STORAGE DEVICE CAPABLE OF RETAINING DATA AFTER AN INCOMPLETE WRITE OPERATION AND METHOD OF ACCESSING SAME

[75] Inventors: Yoichi Koyanagi; Toshiyuki Shimizu, both of Kawasaki, Japan

[73] Assignee: Fujitsu Limited, Kawasaki, Japan

[21] Appl. No.: 828,690

[22] Filed: Mar. 31, 1997

[30] Foreign Application Priority Data

Oct. 16, 1996 [JP] Japan ................................. 8-273564

[51] Int. Cl.$^6$ ................................................. G11C 16/06
[52] U.S. Cl. ............................... 365/185.11; 365/185.33; 365/228
[58] Field of Search .................... 365/185.11, 185.33, 365/228

[56] References Cited

U.S. PATENT DOCUMENTS

| | | | |
|---|---|---|---|
| 5,245,572 | 9/1993 | Kosonocky et al. | 365/185.11 |
| 5,361,343 | 11/1994 | Kosonocky et al. | 365/185.11 |
| 5,422,847 | 6/1995 | Suizu | 365/189.01 |
| 5,577,194 | 11/1996 | Wells et al. | 395/182.06 |

*Primary Examiner*—David C. Nelms
*Assistant Examiner*—Andrew Q. Tran
*Attorney, Agent, or Firm*—Staas & Halsey

[57] ABSTRACT

A storage region formed of a nonvolatile storage device is divided into two blocks; block '0' and block '1'. In a process for writing data, the magic Nos. of the blocks '0' and '1' are checked. On condition that both the magic Nos. have a correct value, the sequential Nos. of the blocks '0' and '1' are compared so as to select the block whose sequential No. has a smaller value. The data to-be-written is written into the selected block. Subsequently, a value obtained by adding "1" to the sequential No. of the unselected block is written as the sequential No. of the selected block. Lastly, the magic No. is written into the selected block. On the other hand, in a process for reading data, the magic Nos. of the blocks '0' and '1' are checked. On condition that both the magic Nos. have the correct value, the block whose sequential No. has a larger value is selected, and the data to-be-read is read out of the selected block. According to the present invention, even in a case where the power of the storage device has turned off during the data write process and where the data write has not been completed, data before the write process remain. Even when the data are the set values or the likes of, for example, a computer system, the remaining data can be used for avoiding the state of the system incapable of starting.

23 Claims, 15 Drawing Sheets

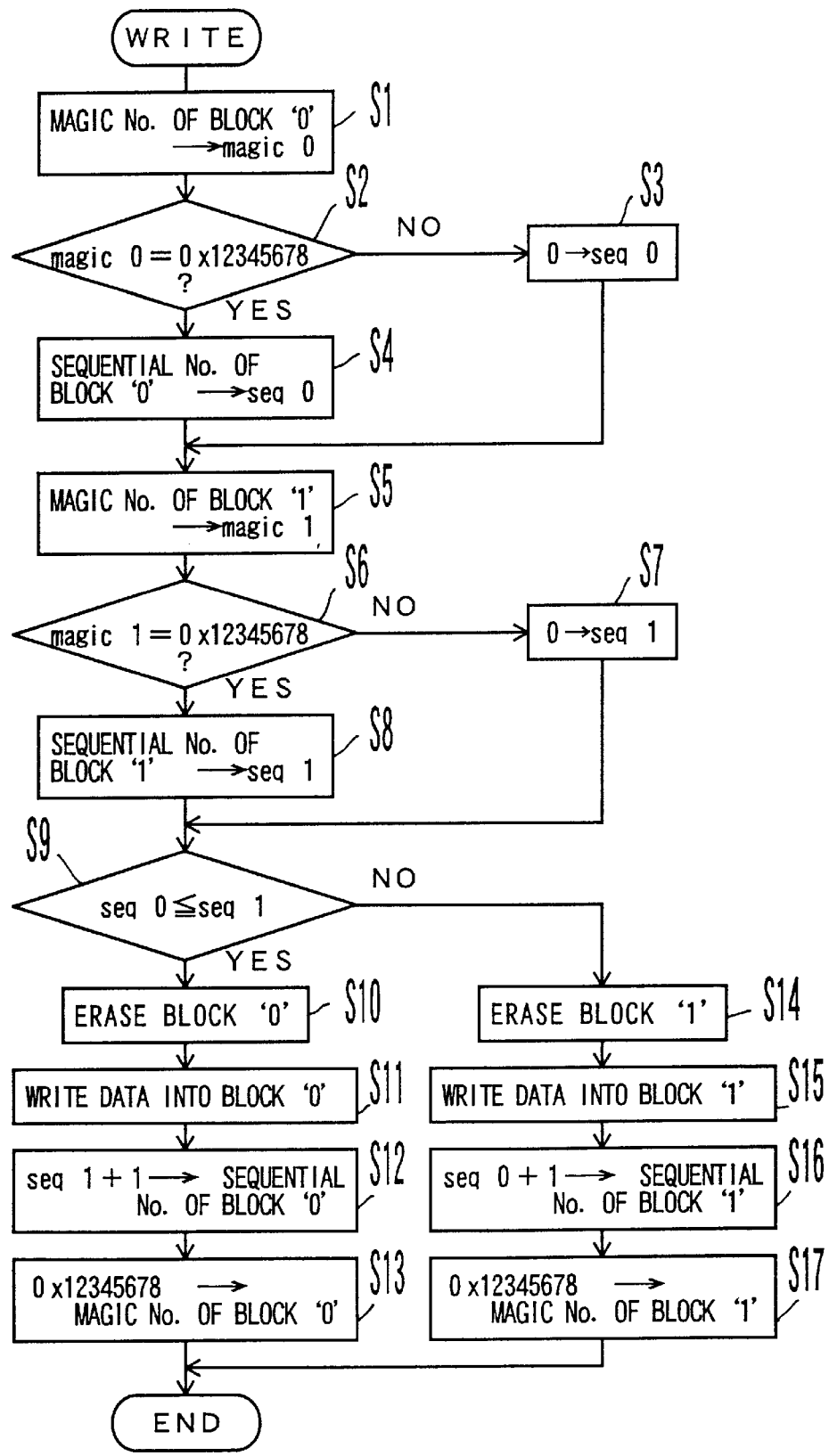
F I G. 1 4

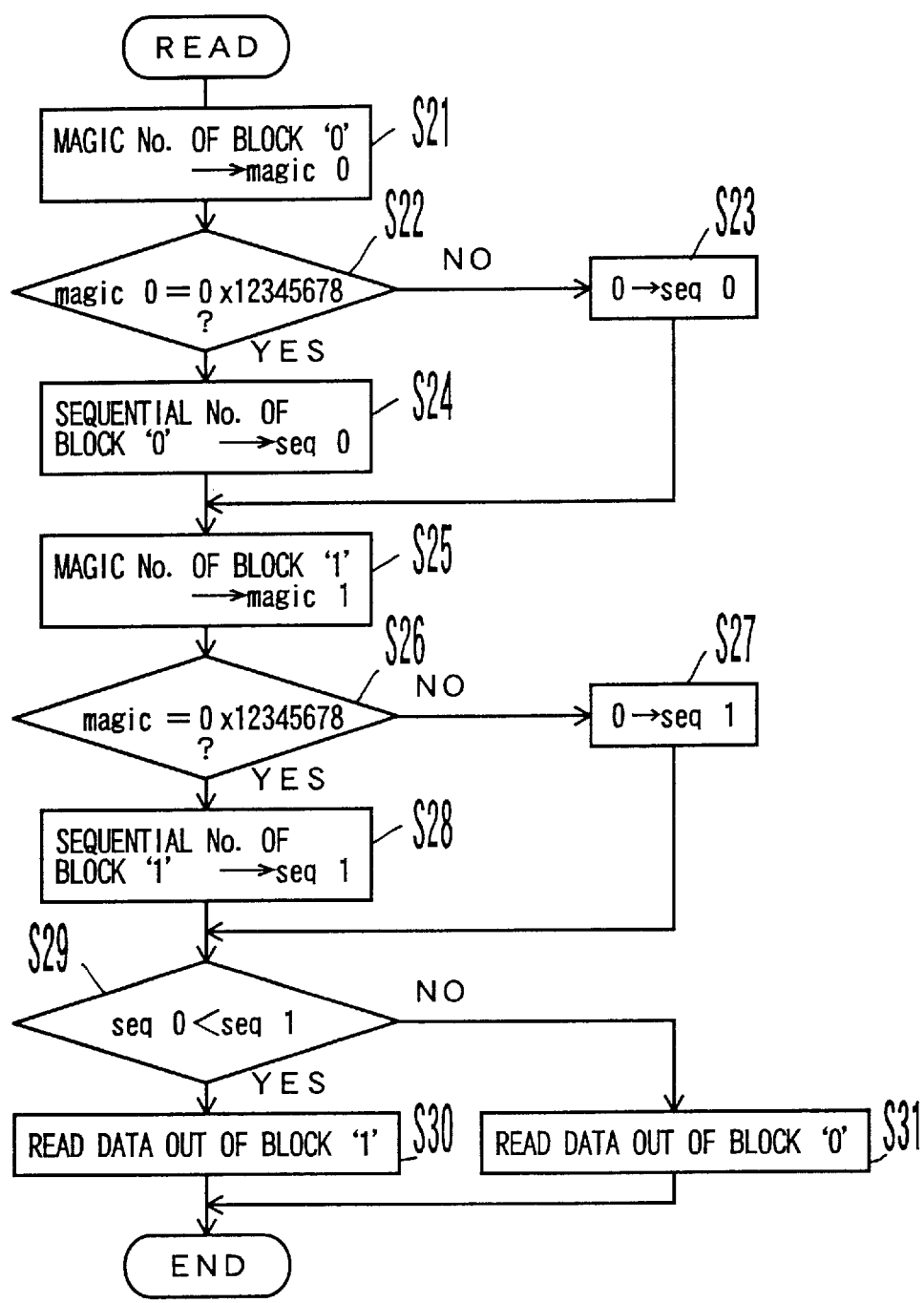
F I G. 1 5

STORAGE APPARATUS HAVING A NONVOLATILE STORAGE DEVICE CAPABLE OF RETAINING DATA AFTER AN INCOMPLETE WRITE OPERATION AND METHOD OF ACCESSING SAME

BACKGROUND OF THE INVENTION

1. Field of the Invention

The present invention relates to a storage apparatus employing a nonvolatile storage device, and a method of writing/reading data into/out of the storage apparatus. More particularly, it relates to a storage apparatus employing a nonvolatile storage device in which stored contents are not lost even when the sudden power-off of the storage apparatus has occurred midway of a write operation, and a method of writing/reading data into/out of the storage apparatus.

2. Description of the Related Art

Electrically alterable nonvolatile storage devices, such as EEPROMs (electrically erasable and programmable ROMs) and flash memories, the stored contents of which do not volatilize even when power is disconnected, have come into wide use within computers and communications equipment which include personal computers, workstations, general-purpose computers, supercomputers, portable terminals, portable telephones, etc.

The nonvolatile storage devices are memory devices each of which, per se, has the property that data stored therein do not volatilize even when power is disconnected. Accordingly, they have heretofore been applied to semiconductor disks etc. which are usable for storing the internal set values of small-sized electronic equipment such as the portable telephones or which are usable in place of fixed disk packs.

Especially in recent years, owing to the advent of flash memories and NAND-type EEPROMs, devices of large storage capacity and low cost per bit have been published and developed as products in succession, and the application thereof has widely extended.

In the application of the nonvolatile storage devices as stated above, no consideration is given to sudden power-off which occurs midway of the operation of writing data. In the case of the power-off, it is apprehended that data stored before will be lost, and that the internal set values will be lost at the worst, resulting in such influence as the failure of the electronic equipment to start.

Particularly in the flash memory, data are usually written by erasing the contents of the whole chip of this memory or erasing the contents of this memory in units of blocks, which are several parts obtained by dividing the whole chip, and thereafter writing data every byte.

In case of updating the data of the flash memory, therefore, the following situation takes place. When the power-off has occurred immediately after erasing the contents of the flash memory or amidst writing the data, the data before the update operation have been erased, but the new data are not written, so that the electronic equipment stops. Accordingly, when the electronic equipment is started next time with the intention of reading the data, only inconsistent data are left behind without significant information.

FIG. 1 is a diagram for explaining the operations of rewriting data in prior-art storage apparatuses each of which employs the nonvolatile storage device.

It is assumed here that data a, b, c and d are to be rewritten into data A, B, C and D as indicated at the upper stage of FIG. 1, respectively. In the storage apparatus based on the conventional nonvolatile storage device, as illustrated at the middle stage of FIG. 1, the data are successively rewritten from the high-order address of the data aggregate as a→A, b→B, c→C and d→D. On the other hand, in the storage apparatus employing the device such as the flash memory in which data are generally or collectively erased, as illustrated at the lower stage of FIG. 1, all the data are first erased in units of erasing blocks (in the flash memory, when data have been erased, a value "1", namely, "0xFFFFFFFF" in which "0x" denotes the hexadecimal notation is given as an initial value), whereupon the data are successively rewritten from the high-order address of the data aggregate as a→A, b→B, c→C and d→D.

Here, in a case where the power of the storage apparatus has turned off during the rewrite of c→C, data which are read out of the storage apparatus after the restoration of the power become (A, B, indefinite value, d) as to the conventional nonvolatile storage device or (A, B, indefinite value, 0xFFFFFFFF) as to the flash memory. The read data are meaningless data which are different from both the data (a, b, c, d) before the rewrite operation and the data (A, B, C, D) after the completion of the rewrite operation. Accordingly, in a case where the data are used as the internal set values or the likes of an electronic equipment, this equipment sometimes becomes inoperable at the worst.

SUMMARY OF THE INVENTION

The present invention has for its object to provide a storage apparatus and a storing method which can cope with the occurrence of power-off during the rewrite of data.

The storage apparatus in the present invention is premised on having a storage region formed of a nonvolatile storage device, and it comprises a first storage segment, a second storage segment, a data write module and a data read module.

The first storage segment includes a storage area based on the nonvolatile storage device.

The second storage segment includes a storage area based on the nonvolatile storage device, the storage area being accessed by location addressing which is logically identical with location addressing for the storage area of the first storage segment. The sizes of the storage areas of the first and second storage segments are usually equal to each other, but the present invention shall not be restricted thereto.

The data write module writes data in a data write operation, into that specific one of the first and second storage segments into which data has been normally written and into which data has not been written latest.

The data read module reads data in a data read operation, out of that specific one of the first and second storage segments into which data has been normally written and into which data has been written latest.

A judgement by the data read module or the data write module as to which of the first and second storage segments has undergone the normal data write and also has undergone the latest data write, is incarnated by further comprising a first No. storage segment and a second No. storage segment by way of example.

The first No. storage segment corresponds to the first storage segment. It stores therein a magic No. which indicates that the data has been normally written into the first storage segment, and a sequential No. which indicates the number of times data have been written into the storage apparatus.

The second No. storage segment corresponds to the second storage segment. It stores therein a magic No. which indicates that the data has been normally written into the second storage segment, and a sequential No. which indicates the number of times data have been written into the storage apparatus.

The first No. storage segment is formed at, for example, the header part of the storage area of the first storage segment, while the second No. storage segment is formed at, for example, the header part of the storage area of the second storage segment.

According to the storage apparatus in the present invention, even in a case where power has turned off during a process for writing data and where the data write has not been completed, data before the write process are held. Therefore, even when the data are the set values or the likes of a system, it can be avoided using the held data that the system becomes incapable of starting.

BRIEF DESCRIPTION OF THE DRAWINGS

FIG. 14 is a flow chart showing the write operation of a storage apparatus; and FIG. 15 is a flow chart showing the read operation of a storage apparatus.

DESCRIPTION OF THE PREFERRED EMBODIMENTS

In the ensuing description, the case of employing a flash memory as a nonvolatile storage device shall be mentioned as one embodiment of the present invention. However, a nonvolatile storage device to be used in the present invention is not restricted to the flash memory, but the present invention is also realizable with any of other nonvolatile storage devices such as EEPROMs, NAND-type EEPROMs, bubble memories and batteried CMOS (complementary metal-oxide-semiconductor) memories.

Figure 1:
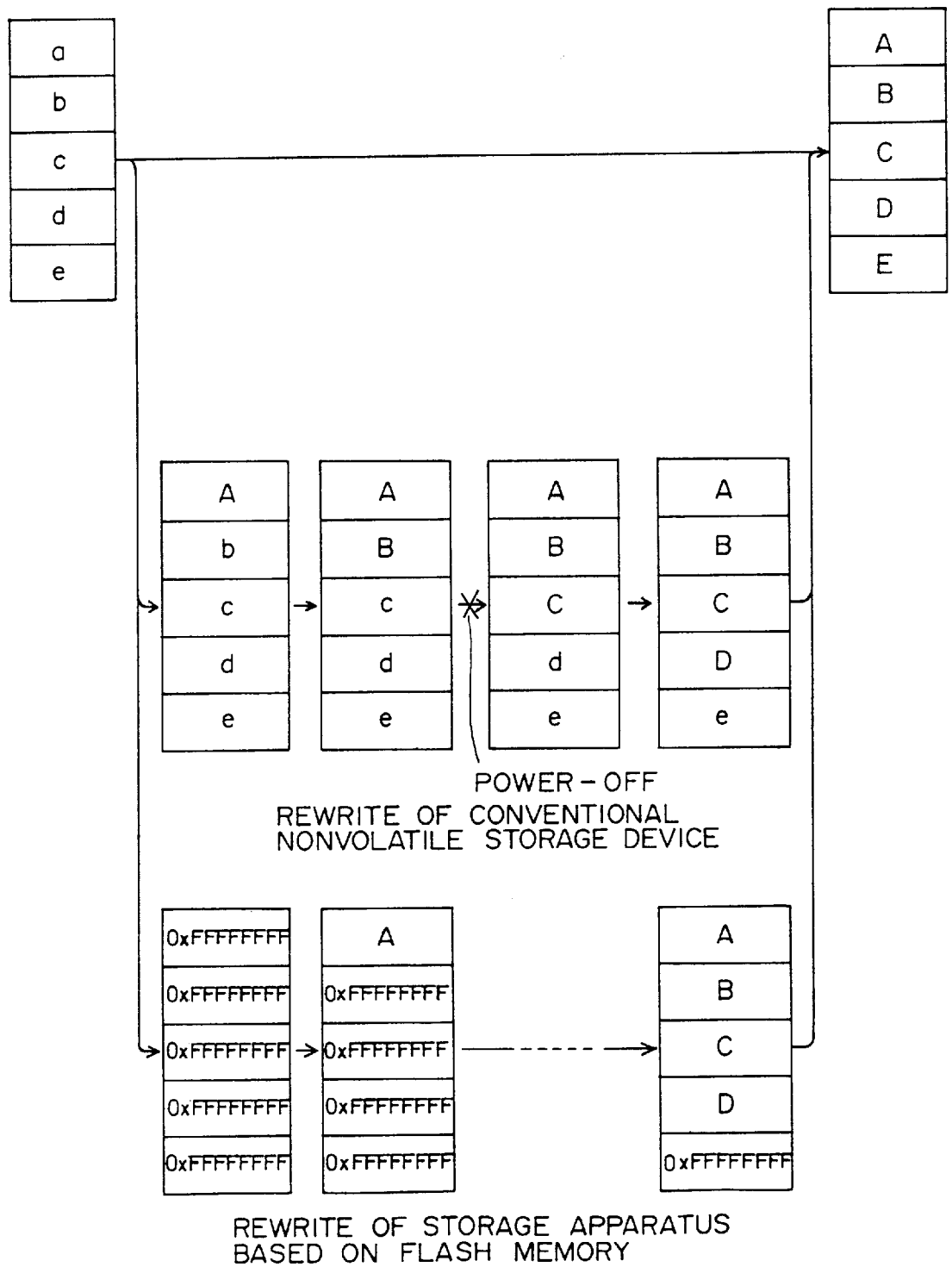
FIG. 1 is a diagram showing data rewrite operations in prior-art storage apparatuses each of which employs a nonvolatile storage device.
Figure 2:
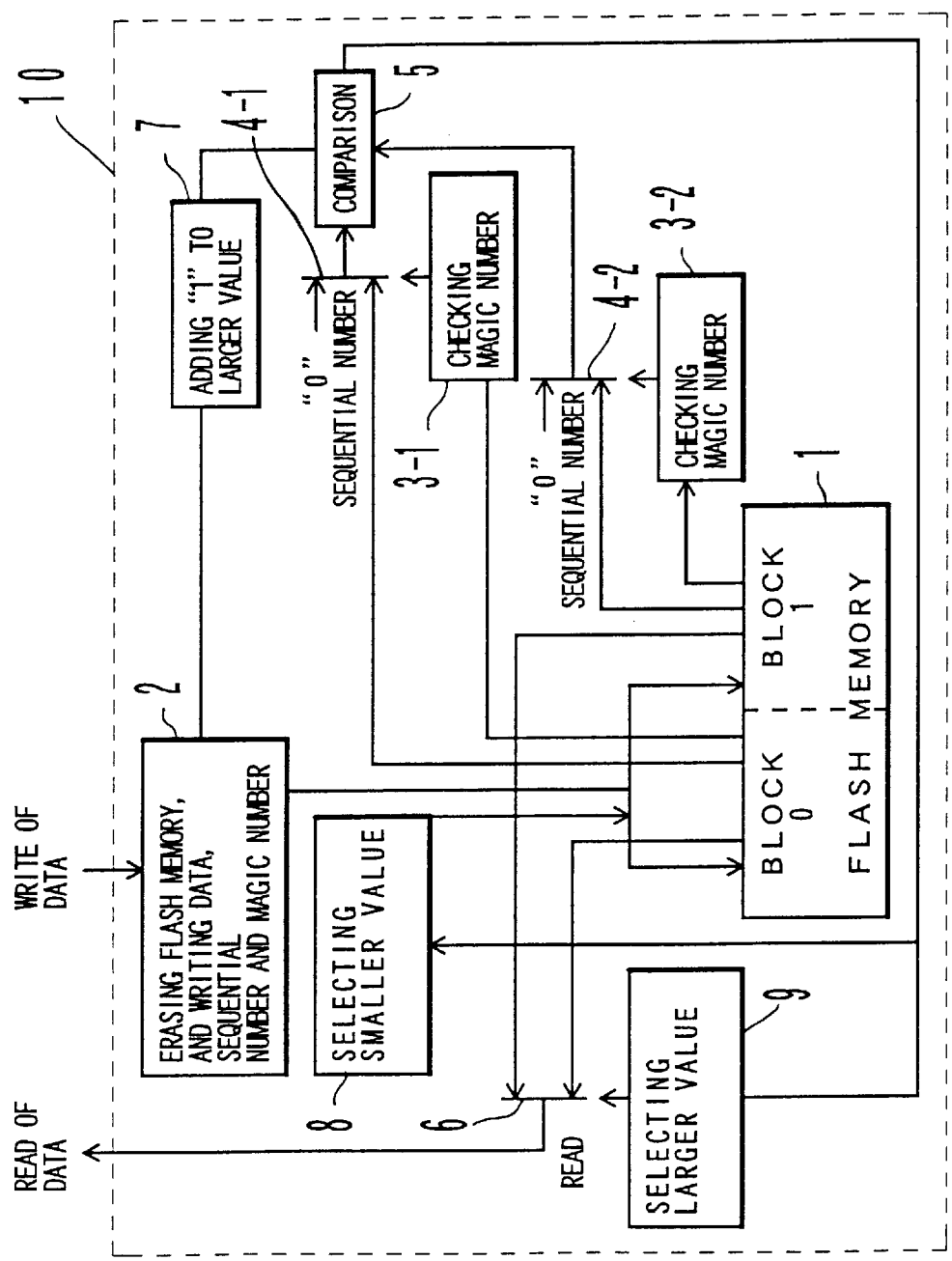
FIG. 2 is a fundamental block diagram of a storage apparatus 10 embodying the present invention.

FIG. 2 is a principle diagram of a storage apparatus 10 in this embodiment. In the figure, the storage apparatus 10 is constructed as one handling a single data unit, in order to illustrate fundamental operations.

Referring to the figure, numeral 1 designates the flash memory which consists of the two blocks of a block '0' and a block '1'. Each of the blocks '0' and '1' of the flash memory 1 is configured of an area into which a sequential No. for indicating the writing sequence of data is written, an area into which a magic No. for managing whether or not data is valid is written, and a data area into which the actual data is written.

In a case where the functions of the storage apparatus 10 are incarnated by hardware, the two blocks '0' and '1' are located at an identical address as viewed from an element accessing the storage apparatus 10, for example, a CPU (central processing unit), and the CPU is made unconscious of the fact of the two blocks except in a special case (for example, in a maintenance job or inspection job). Alternatively, it is also possible to adopt a construction in which the CPU is caused to recognize the two separate blocks '0' and '1' in the storage apparatus 10, and in which the functions of the storage apparatus 10 are incarnated by software.

By the way, in the case where the flash memory is employed as the nonvolatile storage device as in this embodiment, the size of each block is equal to the erasing unit of the flash memory or is integral times as large as the erasing unit. Besides, the sizes of the block '0' and block '1' are usually equal to each other, but the present invention shall not be restricted thereto.

Numeral 2 designates an erase/write module which erases the stored contents of the flash memory 1, and which writes the data, sequential No. and magic No. into the flash memory 1. Symbols 3-1 and 3-2 denote magic No. check modules each of which checks whether or not the magic No. has a correct value.

Symbols 4-1 and 4-2 and numeral 6 denote selectors. The selectors 4-1 and 4-2 select and deliver the sequential Nos. read out of the blocks '0' and '1' of the flash memory 1 when the magic Nos. have been judged correct by the corresponding magic No. check modules 3-1 and 3-2, respectively. On the other hand, the selectors 4-1 and 4-2 select and deliver "0" when the corresponding magic Nos. are not correct. The selector 6 operates to read data out of that block of the flash memory 1 whose sequential No. has a larger value between the sequential Nos. delivered from the selectors 4-1 and 4-2, on the basis of the compared result of a comparison module 5 to be stated below.

The comparison module 5 compares the outputs of the selectors 4-1 and 4-2. On the basis of the compared result of the comparison module 5, data is read or erased out of the flash memory 1 or is written thereinto in the following way:

(1) In reading data, that specific block of the flash memory 1 whose sequential No. has a larger value between the sequential Nos. delivered from the selectors 4-1 and 4-2 is selected by the selector 6 (processing 9 in FIG. 2), and the data is read out of the specific block.

(2) In writing data, that specific block of the flash memory 1 whose sequential No. has a smaller value between the sequential Nos. delivered from the selectors 4-1 and 4-2 is selected (processing 8), and the specific block is erased and has the data written thereinto. Further, "1" is added to the value of the larger one of the sequential Nos. of the blocks '0' and '1' (processing 7), and the resulting sequential No. value is written into the block into which the data has been written (processing 2).

Figure 3:
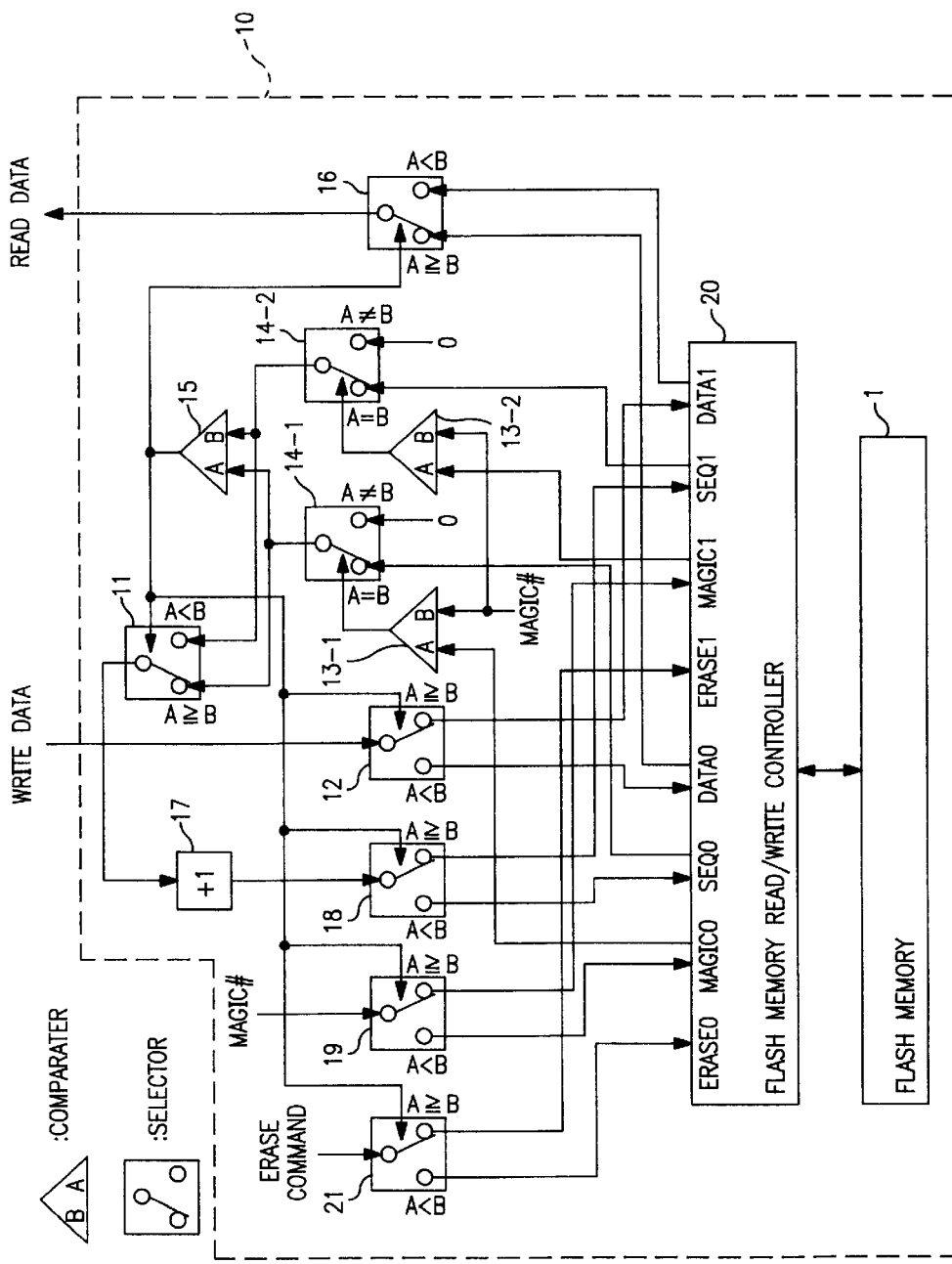
FIG. 3 is a circuit arrangement diagram in the case where the storage apparatus 10 shown in FIG. 2 is incarnated by circuits.

FIG. 3 is a circuit arrangement diagram corresponding to FIG. 2, in the case where the storage apparatus 10 is incarnated by circuits.

Referring to FIG. 3, the flash memory 1 is connected with a flash memory controller 20.

The flash memory controller 20 controls the operation of reading/writing data out of/into the flash memory 1. The read/write data out of/into the flash memory 1, and control signals for this memory 1 are transferred through the flash memory controller 20. Expressions "erase", "magic", "seq" and "data" contained within the flash memory controller 20 in FIG. 3 indicate that the signals are a data erase signal, the magic No. and the sequential No. for the flash memory 1 and the read/write data of the flash memory 1, respectively. Besides, numerals '0' and '1' succeeding the above expressions indicate the corresponding blocks within the flash memory 1, respectively.

Comparators 13-1 and 13-2 correspond to the magic No. check modules 3-1 and 3-2 shown in FIG. 2, respectively. An expression "magic#" indicated at one input of each of the comparators 13-1 and 13-2 signifies that each comparator compares the magic No. with its other input.

Further, a comparator 15 corresponds to the comparison module 5 shown in FIG. 2, while selectors 14-1, 14-2 and 16 correspond to the respective selectors 4-1, 4-2 and 6 shown in FIG. 2. In the read process of the storage apparatus 10, the selector 16 selects and delivers the data of the block whose sequential No. has the larger value, between the data items (data0 and data1) delivered from the flash memory 1 through the flash memory controller 20. Thus, the processing 9 in FIG. 2 is incarnated.

An adder 17 incarnates the processing 7 in FIG. 2. That is, it adds "1" to that larger value of the sequential Nos. of the blocks '0' and '1' which is delivered from a selector 11.

Selectors 12, 18 and 19 select the block of the smaller sequential No. so as to deliver the write data, sequential No. and magic No. to the selected block, respectively. Thus, the processing items 2 and 8 in FIG. 2 are incarnated. Besides, a selector 21 delivers a signal for erasing data before the data write into the flash memory 1, to the block into which the write data is to be written (i. e., the block which has the smaller sequential No.).

Incidentally, FIG. 3 illustrates the schematic circuit arrangement with importance attached to the flow of the data, and a control circuit for controlling the sequence of the operations of the various circuits, etc. are further required in an actual circuit arrangement.

There will now be described the operations of the storage apparatus 10 in the cases where write and read processes are iterated. By the way, in the initial state, the values of the flash memory 1 are all "0xFFFFFFFF". In addition, although the value of the magic No. may be any specified value, it is set at "0x12345678" (32 bits) here. (Symbol "0x" denotes that the pertinent number is based on the hexadecimal notation. The same applies hereinbelow.) The sequential No. is an integer expressed with 4 bytes (32 bits), and it is written into the specified position of each of the blocks '0' and '1', for example, the header part of each block. The reason why each of the magic No. and the sequential No. is configured of 4 bytes (32 bits) in this embodiment, is that a 32-bit CPU is supposed as the CPU which accesses the flash memory 1 in this embodiment. The present invention, however, shall not be especially restricted to the bit configuration. The sequential No. may be of any bits as long as the number which the contents of the flash memory 1 can be rewritten (about 100,000 times as to the present-day flash memory) is satisfactorily covered. On the other hand, since the magic No. indicates the validity of the data of the pertinent block, it may be of any bits as long as the probability at which it becomes the same value due to a casual coincidence is sufficiently low in a case where the data has rewritten on account of any cause.

The operations of the storage apparatus 10 in the cases of iterating the write and read processes proceed as described below with reference to FIGS. 4 through 9.

(a) Write of Data A

Figure 4:
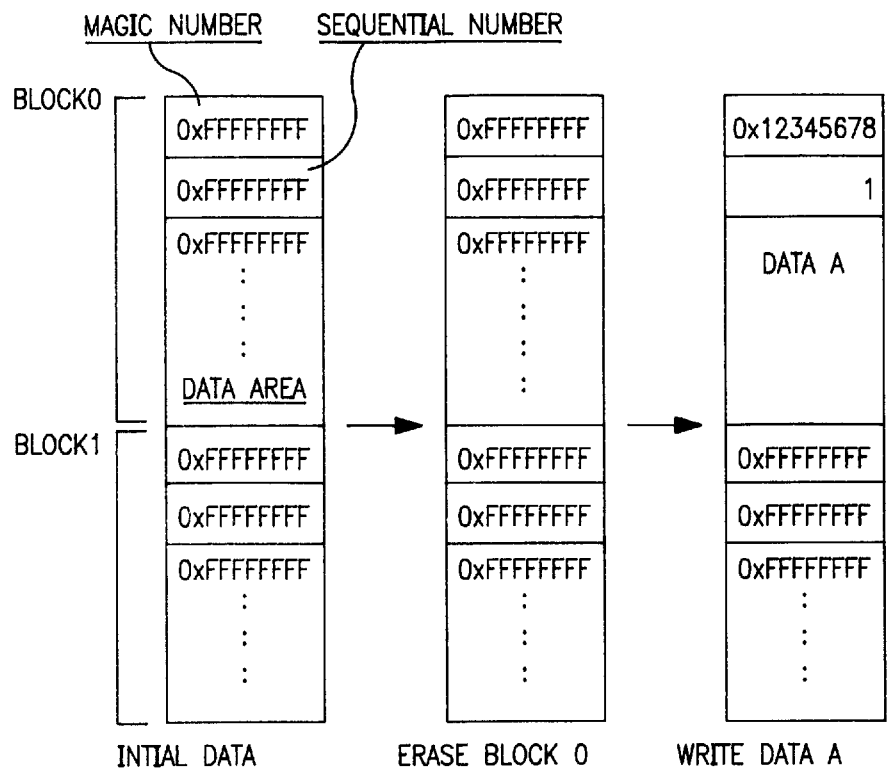
FIG. 4 is a diagram for explaining a process for writing data A into the storage apparatus 10 in the initial state thereof.

FIG. 4 is a diagram for explaining the execution of a process for writing data A into the storage apparatus 10 in the initial state.

In the initial state, as shown in FIG. 4, both the magic Nos. stored in the header parts of the respective blocks '0' and '1' of the flash memory 1 are "0xFFFFFFFF" which is not the correct value ("0x12345678").

In the ordinary state of the storage apparatus 10, when the value of the magic No. is not correct, the selector 4-1 or 4-2 in FIG. 2 selects and delivers "0". That is, the sequential No. is treated as "0".

With this expedient, since no value is smaller than "0", an ordinary operation of writing data proceeds in such a way that either block whose magic No. is not of the correct value has its contents erased therefrom and has the data written thereinto (on the ground that, as illustrated in FIG. 2, the data is written into either block whose sequential No. is of smaller value (processing items 2 and 8)). On the other hand, an ordinary operation of reading data proceeds in such a way that the data is read out of either block whose magic No. is correct (on the ground that, as illustrated in FIG. 2, the data is read out of either block whose sequential No. is of larger value (processing items 6 and 9)).

Meanwhile, in the initial state, both the blocks '0' and '1' have the incorrect magic Nos., so that the sequential Nos. of both the blocks are treated as "0". In view of the compared result of the comparison module 5, the specific block into which data is to be written may be either of the two blocks '0' and '1'. Here, it is assumed to select the block '0'.

When the block '0' is selected, the erase/write module 2 in FIG. 2 erases the contents of the block '0' and writes the data A into this block as shown in FIG. 4. Subsequently, the incremental value "1" is added to the value "0" of the sequential No. of the selected block '0', thereby to obtain an incremented value "1", which is written as the sequential No. of the block '0'. Lastly, the magic No. "0x12345678" is written into the block '0'.

(b) Read of Data

Figure 5:
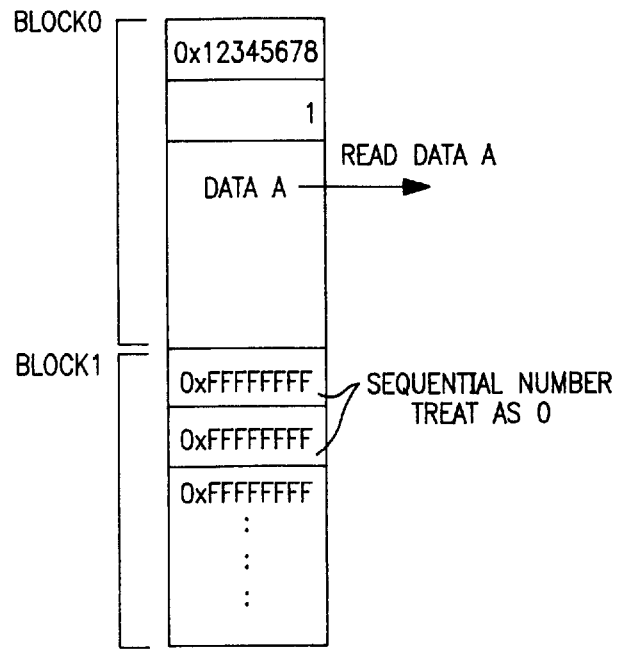
FIG. 5 is a diagram for explaining a process for reading data out of the storage apparatus 10 in the state in which the write of the data A in FIG. 4 has ended.

FIG. 5 is a diagram for explaining the execution of a process for reading data out of the storage apparatus 10 in the state in which the write of the data A in FIG. 4 has ended.

As shown in FIG. 5, the magic No. of the block '0' has the correct value (0x12345678), and hence, the value "1" being the sequential No. of the block '0' is read out through the selector 4-1 in accordance with the checked result of the magic No. check module 3-1. In contrast, the magic No. of the block '1' has the incorrect value (0xFFFFFFFF), and hence, the sequential No. of the block '1' is treated as "0" by the selector 4-2.

The comparison module 5 compares the outputs "1" and "0" of the respective selectors 4-1 and 4-2. On the basis of the compared result of the module 5, the selector 6 selects the block '0' whose sequential No. has the larger value "1". In consequence, the data A stored in the selected block '0' is read out as the read data from the storage apparatus 10.

(c) Write of Data B (Updating Contents as Data A→B)

Figure 6:
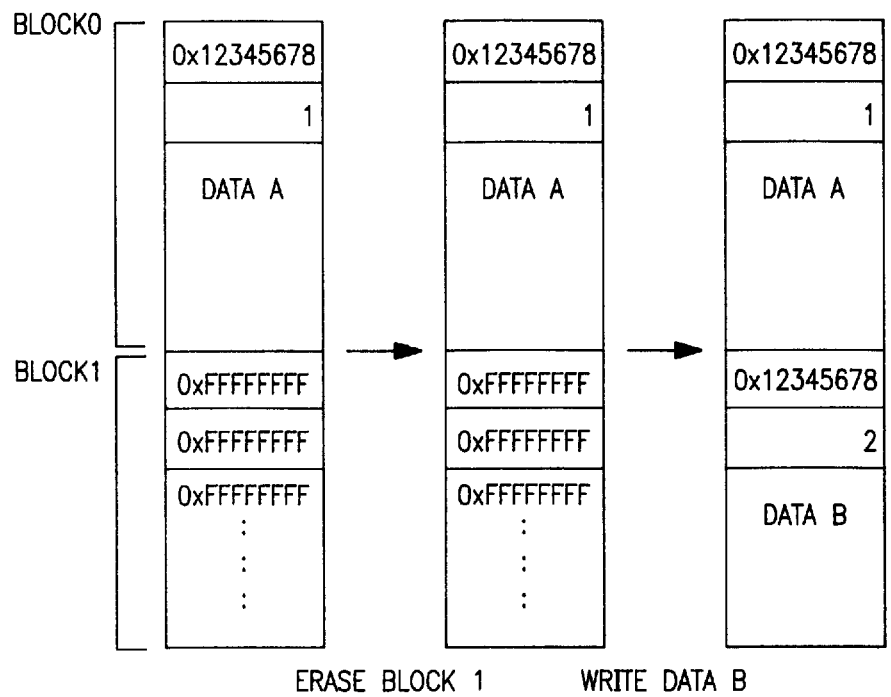
FIG. 6 is a diagram for explaining a process for writing data B into the storage apparatus 10 in the state in which the write of the data A in FIG. 4 has ended.

FIG. 6 is a diagram for explaining the execution of a process for writing data B into the storage apparatus 10 in the state in which the write of the data A in FIG. 4 has ended.

In case of updating the contents of the storage apparatus 10 into the data B in the state in which the data A is stored in the block '0' of the flash memory 1 as shown in FIG. 4, the new data B is written into the block '1' whose sequential No. is treated as "0", as shown in FIG. 6, and an incremented value "2" is set as the sequential No. of the block '1', as also shown in FIG. 6.

More specifically, the data B is written as stated below.

Since the magic No. of the block '0' has the correct value, the stored value "1" is read out of the block '0' as the sequential No. of this block. In contrast, since the magic No. of the block '1' has the incorrect value, the sequential No. of the block '1' is treated as the value "0".

The comparison module 5 compares the values "1" and "0" of the sequential Nos. Then, as seen from FIG. 6, the block '1' being the block whose sequential No. has the smaller value is selected, and the selected block '1' has its data erased therefrom and has the data B written thereinto. Subsequently, the incremental value "1" is added to the larger value "1" of the sequential Nos. of the blocks '0' and '1', thereby to obtain the incremented value "2", which iswritten as the sequential No. of the block '1'. Lastly, the magic No. "0x12345678" is written into the block '1'.

(d) Read of Data

Figure 7:
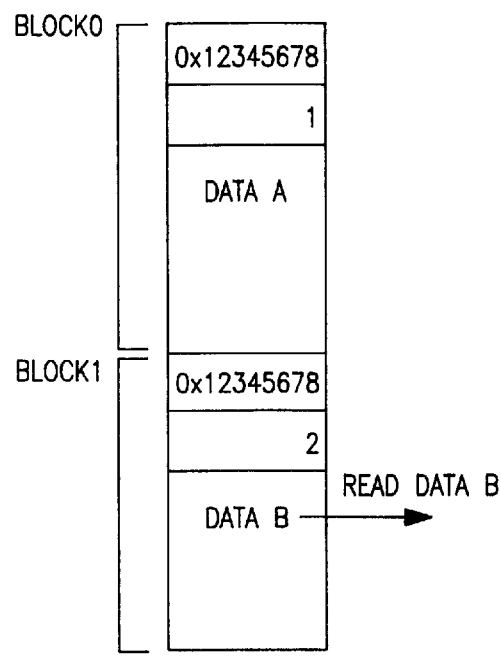
FIG. 7 is a diagram for explaining a process for reading data out of the storage apparatus 10 in the state in which the write of the data B in FIG. 6 has ended.

FIG. 7 is a diagram for explaining the execution of a process for reading data out of the storage apparatus 10 in the state in which the write of the data B in FIG. 6 has ended.

The read of data from the storage apparatus 10 in which the data A and B are stored as shown in FIG. 6, proceeds as stated below.

As shown in FIG. 7, the magic No. of the block '0' is "0x12345678" being the correct value, and hence, the stored value "1" is subsequently read out as the sequential No. of the block '0'. Likewise, the magic No. of the block '1' is also "0x12345678" being the correct value, and hence, the stored value "2" of the sequential No. of the block '1' is read out.

The comparison module 5 compares the values "1" and "2" of the sequential Nos. Then, the block '1' being the block whose sequential No. has the larger value is selected, and the data B stored in the selected block '1' is read out.

That is, the data B written anew is read out between the data A and the data B, just as the data of the storage apparatus 10 has been updated as A→B (with respect to the data read operation shown in FIG. 5).

In this regard, if the power of the storage apparatus 10 turns off during the operation shown in FIG. 6 for writing the update data B, the write operation will be interrupted, and the write of the data B will become incomplete. However, the data A of the block '0' remains in the storage apparatus 10, and the data items do not entirely volatilize.

(e) Write of Data C (Updating Contents as Data A→C)

Figure 8:
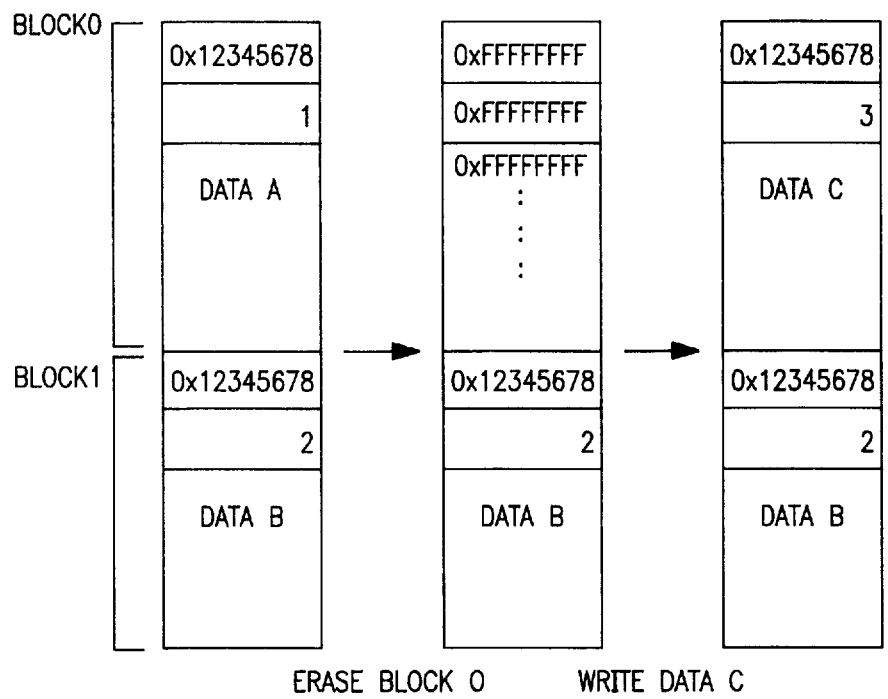
FIG. 8 is a diagram for explaining a process for writing data C into the storage apparatus 10 in the state in which the write of the data B in FIG. 6 has ended.

FIG. 8 is a diagram for explaining the execution of a process for writing data C into the storage apparatus 10 in the state in which the write of the data B in FIG. 6 has ended.

In case of updating the contents of the storage apparatus 10 into the data C in the state in which the data items A and B are respectively stored in the blocks '0' and '1' of the flash memory 1 as shown in FIG. 6, the new data C is written into the block '0' whose sequential No. is "1", as shown in FIG. 8, and an incremented value "3" is set as the sequential No. of the block '0', as also shown in FIG. 8.

More specifically, the data C is written as stated below.

Since the magic No. of the block '0' has the correct value, the stored value "1" is read out of the block '0' as the sequential No. of this block. Likewise, since the magic No. of the block '1' also has the correct value, the value "2" of the sequential No. is read out of the block '1'. The comparison module 5 compares the values "1" and "2" of the sequential Nos. Then, as seen from FIG. 8, the block '0' being the block whose sequential No. has the smaller value is selected, and the selected block '0' has its data erased therefrom and has the data C written thereinto. Subsequently, the incremental value "1" is added to the larger value "2" of the sequential Nos. of the blocks '0' and '1', thereby to obtain the incremented value "3", which is written as the sequential No. of the block '0'. Lastly, the magic No. "0x12345678" is written into the block '0'.

(f) Read of Data

Figure 9:
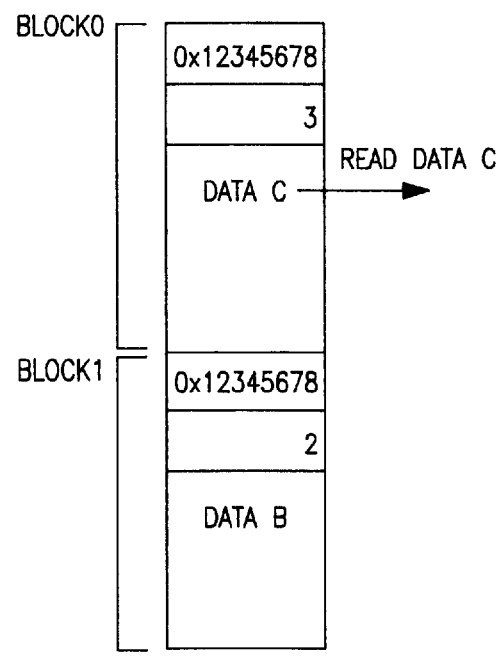
FIG. 9 is a diagram for explaining a process for reading data out of the storage apparatus 10 in the state in which the write of the data C in FIG. 8 has ended.

FIG. 9 is a diagram for explaining the execution of a process for reading data out of the storage apparatus 10 in the state in which the write of the data C in FIG. 8 has ended.

The read of data from the storage apparatus 10 in which the data B and C are stored as shown in FIG. 8, proceeds as stated below.

As shown in FIG. 9, the magic No. of the block '0' has the correct value, and hence, the stored value "3" is read out of the block '0' as the sequential No. thereof. Likewise, the magic No. of the block '1' also has the correct value, and hence, the stored value "2" is read out of the block '1' as the sequential No. thereof.

The comparison module 5 compares the values "3" and "2" of the sequential Nos. Then, the block '0' being the block whose sequential No. has the larger value is selected, and the data C stored in the selected block '0' is read out.

That is, the data C written anew is read out between the data B and the data C, just as the data of the storage apparatus 10 has been updated as B→C (with respect to the data read operation shown in FIG. 7).

The updated data is always read out properly by iterating the above operations. Even in a case where the processing has become incomplete due to sudden power-off or the like in any operation of the above processes, the data of the flash memory 1 do not entirely volatilize, and the stored contents thereof are not destroyed, either, for the following reasons: As described above, only one of the two blocks of the flash memory 1 is subjected to the erase/write operation. Moreover, which of the data items of the individual blocks is correct and is new, are respectively managed by the magic Nos. and the sequential Nos.

Figure 10:
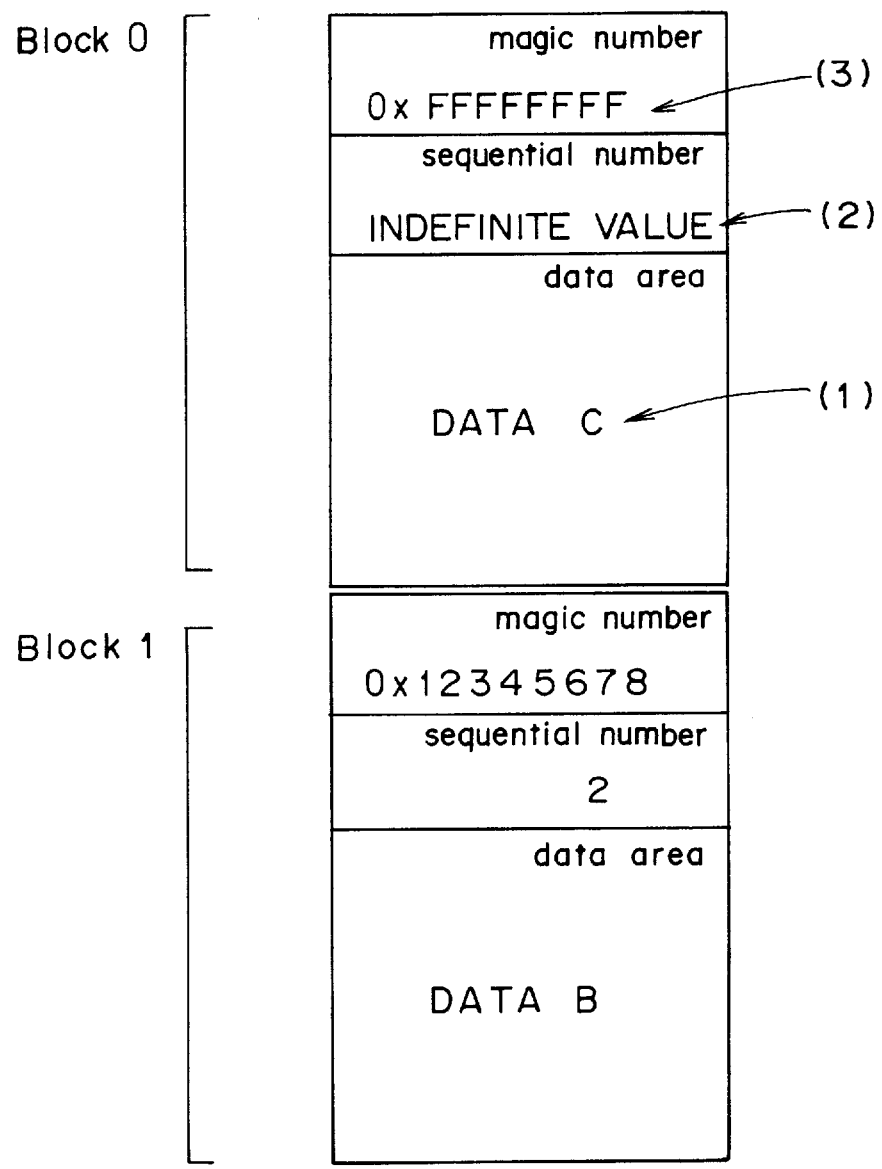
FIG. 10 is a diagram for explaining the storage apparatus 10 in the case where power-off has occurred before the completion of data write.

By way of example, FIG. 10 illustrates a case where the power-off has occurred during the write of the sequential No. after the write of the data C in FIG. 8.

As seen from FIG. 10, data stored in the storage apparatus 10 is rewritten after the selection of the block '0' and the succeeding erase of the data as shown in FIG. 8, in the order of (1) that the new data C is first written into the data area of the block '0', (2) that the sequential No. is subsequently written, and (3) that the magic No. is lastly written. Let it be supposed that the power of the storage apparatus 10 has turned off during, for example, the write of the sequential No. (2) midway of the rewrite process, so the write of the sequential No. has been interrupted (that is, the sequential No. has become an indefinite value as indicated in FIG. 10). Herein, the write of the magic No. (3) is not completed yet, and hence, the magic No. of the block '0' does not have the normal value (0x12345678). Even in the supposed case, therefore, that data B of the block '1' which is the latest data having been normally written is read out in the operation of reading data out of the storage apparatus 10 after the restoration of the power. In other words, owing to the fact that the magic No. is written lastly, when the power-off has occurred before the completion of the write of the magic No., the magic No. does not become the correct value, and the corresponding data is not recognized as being correct.

In addition, the sequential No. denotes the number of times which data items have been written into the storage apparatus 10. Therefore, the number of times of data writes into the nonvolatile storage device which is usually writable a limited number of times can be checked by monitoring the sequential No.

By the way, in the foregoing process shown in FIG. 4, 6 or 8, the stored contents are first erased from the block into which the new data is to be written. This is grounded on the fact that the storage apparatus 10 includes the flash memory 1 as the nonvolatile storage device. Therefore, in case of employing any other device which does not require the general or collective erase, only the magic No. may be erased from the block into which the new data is to be written.

As described above, the present invention accomplishes its object in the following way:

(1) In writing data into a storage apparatus, data units to be stored are alternately written into two blocks, and in reading data out of the storage apparatus, the latest data unit having been normally written is read between the data units stored in the two blocks.

(2) In each block, an area for a magic No. indicative of the validity of data and a sequential No. indicative of the write history of the data is provided at the specified location of the particular block, for example, the header part thereof. Data is written or read after checking the magic No. and the sequential No.

(3) In reading data stored in a storage apparatus, magic Nos. stored in the specified areas of two blocks are checked. On condition that one of the magic Nos. has a correct value, the data is read out of the block whose magic Nos. has the correct value.

(4) In reading data stored in a storage apparatus, magic Nos. stored in the specified areas of two blocks are checked. On condition that both the magic Nos. have a correct value, the data is read out of the block whose sequential No. (indicating the write history of the data) has a larger value.

(5) In writing data into a storage apparatus, magic Nos. stored in the specified areas of two blocks are checked. On condition that neither of the magic Nos. has a correct value, the first block is selected, the contents of the first block are erased, and the data to be written is written into the first block. Subsequently, a value "1" is written as a sequential No. in the header area of the first block. Lastly, the magic No. of correct value is written into the header area of the first block.

(6) In writing data into a storage apparatus, magic Nos. stored in the specified areas of two blocks are checked. On condition that only one of the magic Nos. has a correct value, the block whose magic No. does not have the correct value is selected, the contents of the selected block are erased, and the data to be written is written into the selected block. Subsequently, a value obtained by adding "1" to the sequential No. of the other block (namely, unselected block) is written as the sequential No. of the selected block into the specified area thereof. Lastly, the magic No. of correct value is written into the header area of the selected block.

(7) In writing data into a storage apparatus, magic Nos. stored in the specified areas of two blocks are checked. On condition that both the magic Nos. have a correct value, sequential Nos. are read out of both the blocks and are compared so as to select the block whose sequential No. has a smaller value. Then, the contents of the selected block are erased, and the data to be written is written into the selected block. Subsequently, a value obtained by adding "1" to a sequential No. stored in the specified area of the other block (namely, unselected block) is written as the sequential No. of the selected block into the specified area thereof. Lastly, the magic No. of correct value is written into the specified area of the selected block.

There will now be described an embodiment in which, in the system controller of a computer system, data such as the architectural information of the system are set in a storage apparatus according to the present invention.

Incidentally, although the case of subjecting a flash memory to erase and write operations in software fashion will be explained below, the present invention can also be realized by hardware.

Figure 11:
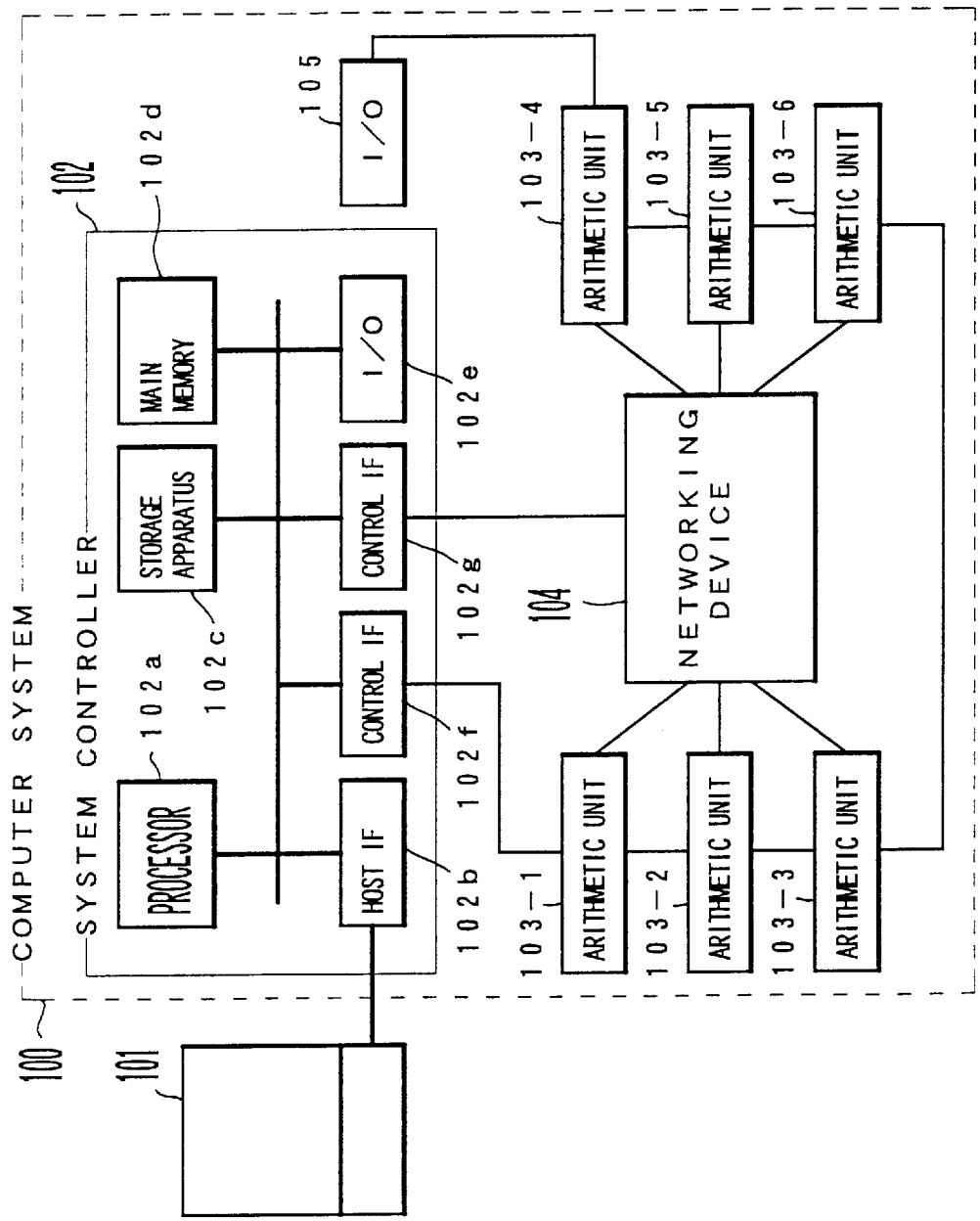
FIG. 11 is a diagram showing a system architecture in the case where a storage apparatus according to the present invention is applied to a computer system.

FIG. 11 is a block diagram showing a system architecture in the case where the storage apparatus in this embodiment is employed for storing the architectural information of the computer system. Referring to the figure, numeral 100 designates the computer system, and numeral 101 a host computer. The host computer 101 is connected with the computer system 100 through a host interface 102b which is provided within the system controller 102 of the computer system 100.

The system controller 102 disposed in the computer system 100 in FIG. 11 includes a processor 102a, the host interface 102b, the storage apparatus 102c for storing the system architecture information etc. therein, a main memory 102d for the processor 102a (such as ROM or RAM), several I/O devices 102e (such as a keyboard, a display and a disk pack), a control interface 102f connected with a plurality of arithmetic units 103-1 through 103-6, and a control interface 102g connected with a networking device 104.

The processor 102a controls the computer system 100 by programs which are stored in the ROM or which are developed in the main memory 102d from the I/O devices 102e. The storage apparatus 102c is that of the present invention employing the flash memory as a storage device, and it has the functions elucidated in conjunction with FIG. 2. Alternatively, the processor 102a endows the storage apparatus 102c with the same functions as those of the storage apparatus 10 shown in FIG. 2, by the programs stored in the ROM or developed in the main memory 102d.

The arithmetic units 103-1 through 103-6 are interconnected through the networking device 104, and they execute various sorts of processing alone or cooperatively. In addition, numeral 105 designates several I/O devices such as a printer, a keyboard, a display and an external storage device.

In the system controller 102 of the computer system 100, the numbers and kinds of the system architecture elements (arithmetic units 103-1 through 103-6 and I/O devices 105) must be kept stored in order to incarnate the functions of the computer system 100, such as a power control and an error monitor.

The set values stored in the system controller 102 are altered in modifying or extending the architecture of the computer system 100. Herein, when such information items have been lost, the start/stop of the whole system or the error monitor becomes impossible, and a serious obstacle is formed.

In this embodiment, therefore, the storage apparatus 102c is divided into the block '0' and the block '1' as stated before, and data on the numbers and kinds of the system architecture elements are alternately written into the respective blocks and are managed. Thus, even when the power of the system 100 has turned off during the operation of writing data into one of the blocks '0' and '1' of the storage apparatus 102c, data before the write operation remains in the other block. After the restoration of the power, the data remaining in the other block is read. Therefore, no serious hindrance is incurred in the whole system 100.

There will now be described a case where a storage apparatus according to the present invention is used for storing BIOS (basic input/output system) codes and system information of a personal computer, a workstation or the like.

Figure 12:
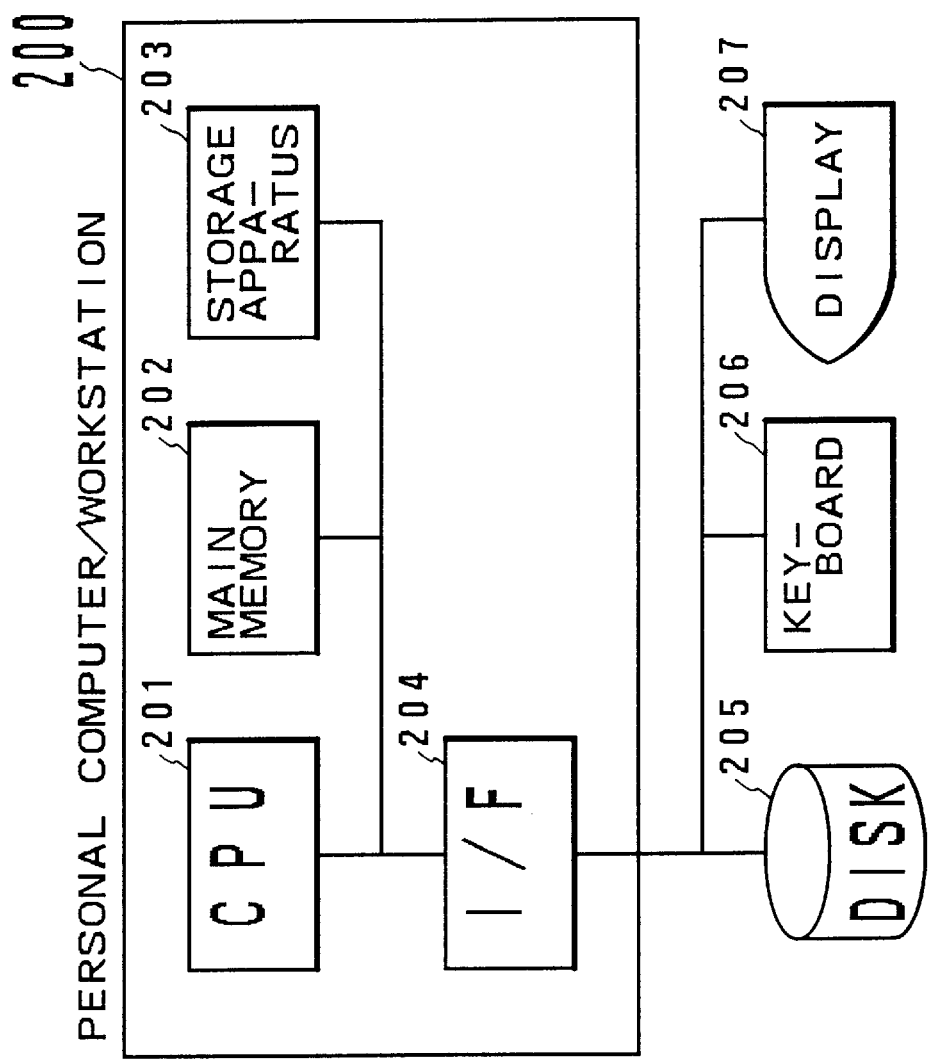
FIG. 12 is a diagram showing a system architecture in the case where a storage apparatus according to the present invention is applied to a personal computer/a workstation.

FIG. 12 is a block diagram showing the system architecture of the personal computer/workstation 200 which employs the storage apparatus according to the present invention.

The personal computer/workstation 200 comprises a CPU 201, a main memory 202 for the CPU 201 as is formed of a ROM, a RAM or the like, a storage apparatus 203 in which the BIOS codes etc. are stored, and an I/O (input/output) interface 204 which connects this personal computer/workstation 200 with I/O devices such as a disk pack 205, a keyboard 206 and a display 207.

The storage apparatus 203 is that of the present invention whose storage device is a nonvolatile one, and it has the functions elucidated in conjunction with FIG. 2. Alternatively, the CPU 201 endows the storage apparatus 203 with the same functions as those of the storage apparatus 10 shown in FIG. 2, by programs which are stored in the ROM or which are developed in the main memory 202 from the disk pack 205 or the like through the I/O interface 204.

The storage apparatus 203 stores therein the system information, the BIOS codes etc. such as the IDs (identifiers) and network addresses of hardware devices with which the personal computer/workstation 200 is connected. Heretofore, such information items have been stored in a ROM or a PROM (programmable ROM). Accordingly, the ROM must be replaced for altering the stored contents, and such a personal computer/workstation lacks in an operating flexibility. When the contents of the information items have become incorrect, there arises such a fault that a system including the ROM becomes incapable of starting. In this regard, the mere substitution of the ROM by a nonvolatile storage device is unsatisfactory for the reason that the contents become incorrect on an occasion where the power of the system has turned off in a data rewrite operation by any chance. On such an occasion, the system cannot be restarted and is difficult of recovery.

In contrast, when the storage apparatus 203 according to the present invention is employed as in the system shown in FIG. 12, the system does not become incapable of restarting in spite of the occurrence of power-off in a data rewrite operation, because data before the rewrite operation are left behind.

There will now be described a case where a storage apparatus according to the present invention is applied to a portable telephone or terminal.

Figure 13:
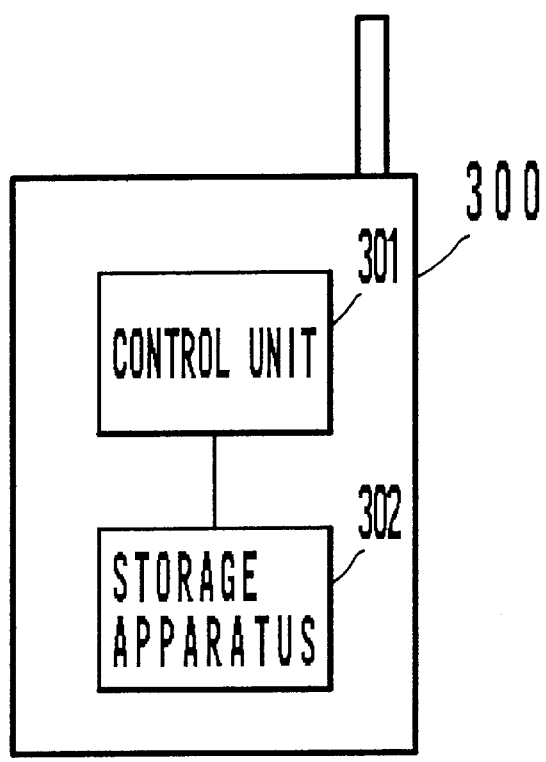
FIG. 13 is a schematic block diagram showing a portable telephone/a portable terminal which employs a storage apparatus according to the present invention.

FIG. 13 is a schematic block diagram showing the construction of the portable telephone/terminal 300 which employs the storage apparatus according to the present invention. Herein, the storage apparatus of the present invention is used for keeping telephone Nos., IDs or the likes stored in the portable telephone/terminal 300. Only the required minimum construction for the usage is illustrated in FIG. 13.

The portable telephone/terminal 300 comprises the storage apparatus 302 of the present invention for storing the telephone Nos., the IDs or the likes therein, and a control unit 301 for controlling the whole portable telephone/terminal 300. Besides, the portable telephone/terminal 300 includes an unshown battery as a driving power source.

With the storage apparatus 302 according to the present invention, even when the battery has run down during the operation of registering the telephone Nos., the IDs or the likes in the portable telephone/terminal 300, it is guaranteed that all the contents of the storage apparatus 302 stored before do not volatilize, but that data before the registering operation remain without fail.

FIGS. 14 and 15 are flow charts showing data write/read processes in the embodiment illustrated in FIG. 11, respectively. The processes in this embodiment will be described with reference to the figures.

When data on the numbers and kinds of the system architecture elements are to be written into the storage apparatus 102c in the computer system 100 shown in FIG. 11, the host computer 101 issues a command for writing setting data, to the system controller 102, and it sends this system controller the data concerning the numbers and kinds of the system architecture elements.

The command and the data are received by the host interface 102b of the system controller 102, the processor 102a of which writes the data into the storage apparatus 102c.

FIG. 14 is the flow chart in the case of writing the data.

In writing the data, the processor 102a first reads out the magic No. of the block '0' of the storage apparatus 102c and writes the read magic No. into the storage area 'magic0' of, e. g., the main memory 102d (step S1 in FIG. 14). The symbol 'magic0' and symbol 'magic1' denote the storage areas in which the values of the magic Nos. of the blocks '0' and '1' are stored, respectively.

Subsequently, the processor 102a checks whether or not the magic No. of the block '0' written into the storage area 'magic0' is "0x12345678" being the correct value (step S2).

When the magic No. of the block '0' has the correct value (i. e., it is equal to "0x12345678"), the control flow of FIG. 14 proceeds to a step S4, at which the processor 102a reads out the sequential No. of the block '0' and writes the read sequential No. into the storage area 'seq0' of, e. g., the main memory 102d. On the other hand, when the magic No. of the block '0' does not have the correct value (i. e., it is not equal to "0x12345678"), the processor 102a writes "0" into the storage area 'seq0' at a step S3, which is followed by a step S5. The symbol 'seq0' and symbol 'seq1' denote the storage areas in which the sequential Nos. of the blocks '0' and '1' are stored, respectively.

At the step S5 succeeding the step S3 or S4, the processor 102a reads out the magic No. of the block '1' and writes the read magic No. into the storage area 'magic1'.

Subsequently, the processor 102a checks whether or not the magic No. of the block '1' written into the storage area 'magic1' is "0x12345678" being the correct value (step S6).

When the magic No. of the block '1' has the correct value (i. e., it is equal to "0x12345678"), the control flow proceeds to a step S8, at which the processor 102a reads out the sequential No. of the block '1' and writes the read sequential No. into the storage area 'seq1'. On the other hand, when the magic No. of the block '1' does not have the correct value (i. e., it is not equal to "0x12345678"), the processor 102a writes "0" into the storage area 'seq1' at a step S7, which is followed by a step S9.

At the step S9 succeeding the step S7 or S8, the processor 102a compares the values of the sequential Nos. in the storage areas 'seq0' and 'seq1'. On condition that the value in the storage area 'seq0' is equal to or smaller than the value in the storage area 'seq1', the processor 102a erases the contents of the block '0' (step S10) and writes the data into this block '0' (step S11).

Besides, the processor 102a adds the incremental value "1" to the value of the sequential No. of the block '1' in the storage area 'seq1' and stores the resulting value in the sequential No. storage area of the block '0' (step S12). Further, it writes the magic No. (=0x12345678) into the magic No. storage area of the block '0' (step S13). Then, the write process is ended.

In contrast, on condition that the value in the storage area 'seq0' is larger than the value in the storage area 'seq1' at the step S9, the processor 102a erases the contents of the block '1' (step S14) and writes the data into this block '1' (step S15).

Besides, the processor 102a adds the incremental value "1" to the value of the sequential No. of the block '0' in the storage area 'seq0' and stores the resulting value in the sequential No. storage area of the block '1' (step S16). Further, it writes the magic No. (=0x12345678) into the magic No. storage area of the block '1' (step S17). Then, the write process is ended.

The data on the numbers and kinds of the system architecture elements have been written into the storage apparatus 102c in the above way. Thereafter, at the start of the computer system 100 by way of example, the processor 102a of the system controller 102 reads out the data stored in the storage apparatus 102c and delivers control signals etc. to the arithmetic units 103-1 through 103-6 through the control interface 102f in accordance with the information items.

By the way, regarding each of the processes for erasing the data of the respective blocks '0' and '1' at the steps S10 and S14, all the data contained in the subject block are erased in the case of employing the flash memory as the nonvolatile storage device of the storage apparatus 102c. On the other hand, only the magic No. may be erased from the block into which the data are to be written, in the case of employing any other device which does not require the general or collective erase.

FIG. 15 is the flow chart showing the process for reading out the data stored in the storage apparatus 102c.

In reading out the data, the processor 102a first reads out the magic No. of the block '0' of the storage apparatus 102c and writes the read magic No. into the storage area 'magic0' (step S21 in FIG. 15). The symbol 'magic0' and symbol 'magic1' denote the storage areas in which the values of the magic Nos. of the blocks '0' and '1' are stored, respectively.

Subsequently, the processor 102a checks whether or not the magic No. of the block '0' written into the storage area 'magic0' is "0x12345678" being the correct value (step S22).

When the magic No. of the block '0' has the correct value (i. e., it is equal to "0x12345678"), the control flow of FIG. 15 proceeds to a step S24, at which the processor 102a reads out the sequential No. of the block '0' and writes the read sequential No. into the storage area 'seq0'. On the other hand, when the magic No. of the block '0' does not have the correct value (i. e., it is not equal to "0x12345678"), the processor 102a writes "0" into the storage area 'seq0' at a step S23, which is followed by a step S25.

At the step S25 succeeding the step S23 or S24, the processor 102a reads out the magic No. of the block '1' and writes the read magic No. into the storage area 'magic1'.

Subsequently, the processor 102a checks whether or not the magic No. of the block '1' written into the storage area 'magic1' has the correct value "0x12345678" (step S26).

When the magic No. of the block '1' has the correct value (i. e., it is equal to "0x12345678"), the control flow proceeds to a step S28, at which the processor 102a reads out the sequential No. of the block '1' and writes the read sequential No. into the storage area 'seq1'. On the other hand, when the magic No. of the block '1' does not have the correct value (i. e., it is not equal to "0x12345678"), the processor 102a writes "0" into the storage area 'seq1' at a step S27, which is followed by a step S29.

At the step S29 succeeding the step S27 or S28, the processor 102a compares the values of the sequential Nos. in the storage areas 'seq0' and 'seq1'. On condition that the value in the storage area 'seq0' is smaller than the value in the storage area 'seq1', the processor 102a reads the data out of the block '1' (step S30).

In contrast, on condition that the value in the storage area 'seq0' is larger than the value in the storage area 'seq1', the processor 102a reads the data out of the block '0' (step S31).

In the above way, the processor 102a writes the data alternately into the two blocks of the storage apparatus 102c and also manages the data while checking the validities of the data with the magic Nos. and checking the update sequence of the data with the sequential Nos. Thus, even when the power-off of the computer system 100 has occurred during the operation of writing the data into one of the two blocks of the storage apparatus 102c, the data before the write operation remain in the other block. Since the remaining data are read out after the recovery of the computer system 100, no serious hindrance is incurred in the whole system 100.

By the way, processes similar to those illustrated in FIGS. 14 and 15 are also executed in any of the aspects of performance other than the computer system 100 shown in FIG. 11.

As described above, according to the present invention, each of the two blocks of a nonvolatile storage device includes areas for storing therein a magic No. indicative of the validity of data and a sequential No. indicative of the write history of the data, and the write/read of the data into/out of the nonvolatile storage device are managed in conformity with the magic Nos. and sequential Nos. of the respective blocks. Therefore, whatever timing the power-off of the nonvolatile storage device has occurred at, the information items are not entirely lost.

Moreover, in a case where the power-off has occurred during the data updating operation of the nonvolatile storage device, merely the update fails, and the information items written before do not volatilize or do not become incorrect values.

What is claimed is:

1. A storage apparatus having a storage region formed of a nonvolatile storage device, comprising:

first storage means including a storage area based on the nonvolatile storage device;

second storage means including a storage area based on said nonvolatile storage device;

data write means for writing data in a data write operation, into one of said first and second storage means whichever has no latest data correctly written thereto; and data read means for reading data in a data read operation, out of that specific one of said first and second storage means into which data has been normally written and into which data has been written latest.

2. The storage apparatus as defined in claim 1, further comprising:
   first number storage means correspondent to said first storage means, for storing therein a magic number which indicates that the data has been normally written into said first storage means, and a sequential number which indicates the number of times data have been written into said storage apparatus; and
   second number storage means correspondent to said second storage means, for storing therein a magic number which indicates that the data has been normally written into said second storage means, and a sequential number which indicates the number of times data have been written into said storage apparatus.

3. The storage apparatus as defined in claim 2, wherein in writing the data into said first storage means, said data write means writes a predetermined value as the magic number into said first number storage means and a first new value as the sequential number thereinto, the first new value being obtained in such a way that the sequential number stored in said second number storage means is changed by a constant value, and in writing the data into said second storage means, said data write means writes the predetermined value as the magic number into said second number storage means and a second new value as the sequential number thereinto, the second new value being obtained in such a way that the sequential number stored in said first number storage means is changed by the constant value.

4. The storage apparatus as defined in claim 3, wherein said data write means writes said predetermined value as said magic number into said first number storage means after the write of said data into said first storage means and the write of said sequential number into said first number storage means have been completed, and writes said predetermined value as said magic number into said second number storage means after the write of said data into said second storage means and the write of said sequential number into said second number storage means have been completed.

5. The storage apparatus as defined in claim 3, wherein the first new value is obtained by adding "1" (one) to said sequential number stored in said second number storage means, and the second new value is obtained by adding "1" to said sequential number stored in said first number storage means.

6. The storage apparatus as defined in claim 2, wherein each of said data write means and said data read means judges if said data has been normally written into said first storage means, depending upon if the magic number stored in said first number storage means is a predetermined value, and judges if said data has been normally written into said second storage means, depending upon if the magic number stored in said second number storage means is the predetermined value.

7. The storage apparatus as defined in claim 2, wherein each of said data write means and said data read means judges that specific one of said first and second storage means into which the data has been written latest, by a comparison between the sequential number stored in said first number storage means and the sequential number stored in said second number storage means.

8. The storage apparatus as defined in claim 2, wherein said first number storage means is constructed within said first storage means, and said second number storage means is constructed within said second storage means.

9. The storage apparatus as defined in claim 8, wherein said first number storage means is constructed at a header part of said storage area of said first storage means, and said second number storage means is constructed at a header part of said storage area of said second storage means.

10. The storage apparatus as defined in claim 2, wherein said data write means erases the stored contents of said first storage means and said first number storage means before writing said data into said first storage means, and erases the stored contents of said second storage means and said second number storage means before writing said data into said second storage means.

11. The storage apparatus as defined in claim 1, wherein the storage areas of said first storage means and said second storage means have equal sizes.

12. The storage apparatus as defined in claim 1, wherein said nonvolatile storage device is a flash memory.

13. A storage apparatus which is erasable every block and which is writable every byte, comprising:
    a flash memory divided into two blocks;
    write means for writing data units to-be-stored alternately into the two blocks; and
    read means for reading the latest data unit normally written, between the data units stored in said two blocks.

14. The storage apparatus having a flash memory as defined in claim 13, wherein
    each of said blocks of said flash memory includes a header area which stores therein a magic number indicative of validity of data and a sequential number indicative of a write history of the data; and
    said write/read means writes and reads the data unit after checking the magic number and the sequential number.

15. The storage apparatus having a flash memory as defined in claim 14, wherein
    in reading the data unit stored in said flash memory, said read means checks the magic numbers stored in the header areas of said two blocks, and on condition that one of said magic numbers has a correct value, said read means reads said data unit out of the block whose magic number has the correct value.

16. The storage apparatus having a flash memory as defined in claim 14, wherein
    in reading the data unit stored in said flash memory, said read means checks the magic numbers stored in the header areas of said two blocks, and on condition that both of said magic numbers have a correct value, said read means reads said data unit out of the block whose sequential number has a larger value.

17. The storage apparatus having a flash memory as defined in claim 14, wherein
    in writing the data unit into said flash memory, said write means checks the magic numbers stored in the header areas of said two blocks, and on condition that neither of said magic numbers has a correct value, said write means selects the first one of said two blocks, erases the contents of the first block and writes said data unit to-be-written into said first block, subsequently writes "1" (one) as the sequential number of the header area of said first block, and lastly writes the magic number into said header area of said first block.

18. The storage apparatus having a flash memory as defined in claim 14, wherein in writing the data unit into said flash memory, said write means checks the magic numbers stored in the header areas of said two blocks, and on condition that only one of said magic numbers has a correct value, said write means selects the block whose magic number does not have the correct value, erases the contents of the selected block and writes said data unit to-be-written into said selected block, subsequently writes a new value as the sequential number of the header area of said selected block, the new value being obtained by adding "1" (one) to the sequential number stored in the header area of the unselected block, and lastly writes the magic number into said header area of said selected block.

19. The storage apparatus having a flash memory as defined in claim 14, wherein in writing the data unit into said flash memory, said write means checks the magic numbers stored in the header areas of said two blocks, and on condition that both of said magic numbers have a correct value, said write means reads the sequential numbers out of both the blocks and compares them, selects the block whose sequential number has a smaller value, erases the contents of the selected block and writes said data unit to-be-written into said selected block, subsequently writes a new value as the sequential number of the header area of said selected block, the new value being obtained by adding "1" (one) to the sequential number stored in the header area of the unselected block, and lastly writes the magic number into said header area of said selected block.

20. A data access method for a storage region formed of a nonvolatile storage device, comprising the steps of:

dividing the storage region based on the nonvolatile storage device, into a first storage area, and a second storage area;

writing data into one of said first and second storage areas whichever has no latest data correctly written thereto; and reading data out of that specific one of said first and second storage areas into which data has been normally written and into which data has been written latest.

21. A data updating method for a storage apparatus formed of a flash memory which is erasable every block and which is writable every byte, comprising the steps of:

dividing the flash memory into two blocks;

writing data units to-be-stored alternately into the two blocks of said flash memory; and reading the latest data unit normally written, between the data units stored in said two blocks.

22. A method of operating a computer-readable storage medium in a computer comprising the steps of:

dividing a storage region based on a nonvolatile storage device, into a first storage area, and a second storage area;

writing data into one of said first and second storage areas whichever has no latest data correctly written thereto; and reading data out of that specific one of said first and second storage areas into which data has been normally written and into which data has been written latest.

23. A method of operating a computer-readable storage medium in a computer comprising the steps of:

writing data units to-be-stored alternately into two divided blocks of a flash memory; and reading the latest data unit normally written, between the data units stored in said two blocks.

* * * * *